United States Patent
Arell

(10) Patent No.: US 8,130,043 B2
(45) Date of Patent: Mar. 6, 2012

(54) MULTI-STAGE POWER AMPLIFIER WITH ENHANCED EFFICIENCY

(75) Inventor: Thomas W. Arell, Basking Ridge, NJ (US)

(73) Assignee: Anadigics, Inc., Warren, NJ (US)

( * ) Notice: Subject to any disclaimer, the term of this patent is extended or adjusted under 35 U.S.C. 154(b) by 260 days.

(21) Appl. No.: 11/706,060

(22) Filed: Feb. 13, 2007

(65) Prior Publication Data

US 2007/0222523 A1    Sep. 27, 2007

Related U.S. Application Data

(63) Continuation of application No. 10/949,509, filed on Sep. 24, 2004, now abandoned.

(60) Provisional application No. 60/505,930, filed on Sep. 25, 2003.

(51) Int. Cl.
*H03F 3/68* (2006.01)

(52) U.S. Cl. ............... 330/302; 330/295; 330/124 R

(58) Field of Classification Search ............ 330/295, 330/302, 124 R, 124 D, 84, 305; 377/560
See application file for complete search history.

(56) References Cited

U.S. PATENT DOCUMENTS

| | | | | |
|---|---|---|---|---|
| 5,236,987 A | * | 8/1993 | Arendt | 524/287 |
| 7,352,239 B2 | * | 4/2008 | Lee et al. | 330/124 R |
| 2003/0048132 A1 | * | 3/2003 | Kagaya et al. | 330/51 |

* cited by examiner

*Primary Examiner* — Michael Shingleton
(74) *Attorney, Agent, or Firm* — Ward & Zinna, LLC

(57) ABSTRACT

A multi-stage RF/Microwave power amplifier circuit is provided that is capable of operating efficiently at multiple output power levels. The amplifier comprises first and second amplifying stages, an output impedance matching network connected to the output of first amplifying stage and an interstage impedance matching network connected between the outputs of said first and second amplifying stages. In a high power mode, the first amplifying stage is enabled and the second amplifying stage is disabled and the output and interstage impedance matching networks present a first value of the output impedance that improves the efficiency of the first amplifying stage. In a low power mode, the first amplifying stage is disabled and the second amplifying stage is enabled, and output and interstage impedance matching networks present a second value of the output impedance that improves the efficiency of the second amplifying stage.

16 Claims, 9 Drawing Sheets

MULTI-STAGE POWER AMPLIFIER WITH ENHANCED EFFICIENCY

CROSS-REFERENCE TO RELATED APPLICATIONS

The present application is a continuation of application Ser. No. 10/949,509 filed Sep. 24, 2004 now abandoned which claims priority benefit under 35 U.S.C. §119 of prior filed U.S. provisional application Ser. No. 60/505,930, filed Sep. 25, 2003, which is incorporated herein by reference in its entirety.

BACKGROUND OF THE INVENTION

The present invention relates to the field of power amplifiers. More particularly, it relates to a multi-stage radio-frequency ("RF") power amplifier having a single input port and a single output port with two or more modes of operation at different power level ranges. Each mode has its active output stage presented with a near optimum load impedance to provide an improved trade off between efficiency and linearity.

Personal wireless communication devices are often required to operate at multiple output power levels to maintain their efficiency (i.e., the ratio of signal output power to the total input power). The required output power level may depend on, inter alia, the signal modulation scheme employed or the quality of the communication channel used by the device. Variable-envelope modulation schemes, such as CDMA (Code Division Multiple Access), for example, typically limit output power because of signal distortion occurring at high output power levels and are usually referred to as linear applications, i.e. requiring the employment of a linear amplifier. Constant-envelope modulation schemes, in contrast, have less stringent power limitations because of greater tolerance to signal distortion. In another aspect, a communication device operating in a poor quality wireless channel may require a higher output power level than when operating in a better quality channel. While low power levels better conserve battery power, high power levels usually assure better signal quality.

The efficiency of a wireless communication device is primarily limited by the efficiency of the device's power amplifier because it imposes the largest drain on the battery. For maximum efficiency, power amplifiers are generally designed to operate at their peak output power, and any deviation from the peak output power reduces the amplifier's efficiency. A power amplifier typically includes a power-amplifying transistor and an impedance matching network to facilitate energy transfer from the transistor to its load, such as for example, an antenna. Impedance matching networks are often precisely designed to maximize energy transfer and to improve the efficiency of the power amplifier. For linear applications, the impedance matching networks are optimized at the maximum expected linear output level to achieve the best compromise between linearity and efficiency since these two properties usually have opposing requirements.

Power amplifiers operating at multiple output power levels may be efficiently implemented by connecting in parallel several power amplifying stages having different power capacities. One such arrangement is shown in FIG. 1. The resulting parallel-stage power amplifier 100 comprises two amplifying stages 110 and 120 each having a power amplifying transistor (not shown), and two impedance matching networks 130 and 140. The output power control in parallel-stage power amplifier 100 is accomplished by enabling or disabling particular amplifying stages, thereby efficiently increasing or decreasing the output power level.

A problem with such parallel-stage design is that each amplifying stage can adversely affect the performance of the other. In one aspect, the impedance matching network of the disabled stage may alter the effective impedance of the active stage and reduce its efficiency. In another aspect, the output impedance of an amplifying transistor may vary during operation adversely affecting that of the other transistor. For example, the output impedance of each transistor depends on whether it is enabled (i.e., operating in its active region) or disabled (i.e., cut-off) and the particular bias voltages that are applied. These conditions may cause cross-coupling and power leakage between the stages, so that each stage operates less efficiently than intended.

Efforts to eliminate the above limitations of the parallel-stage power amplifier have focused on designs using quarter-wavelength transformers as impedance matching components 130 and 140 of power amplifier 100 shown in FIG. 1 and described in U.S. Pat. No. 5,541,554 to Stengel et al. A quarter-wavelength transformer is a section of a transmission line that is equal to one-quarter of a wavelength ($\lambda$) at the amplifier's operating frequency (f0). See, e.g., Rudolf Graf, MODERN DICTIONARY OF ELECTRONICS (7th ed. 1999). A quarter-wavelength transformer transforms an input impedance Z1, to an output impedance Z2 according to the following equation: $Z2=Z0^2/Z1$, where Z0 is the characteristic impedance of the transmission line forming the quarter-wavelength transformer. Stengel et al. exploits this characteristic of a quarter-wavelength transformer to isolate the disabled stage from the active stage. In particular, by saturating the amplifying transistor in the disabled stage, the input to its quarter-wavelength transformer is effectively short-circuited to ground. In turn, the quarter-wavelength transformer transforms the short-circuit at its input (i.e., Z1=0) to an infinite impedance at its output (i.e., Z2=∞), thus, effectively isolating the active stage from the disabled stage.

Designs based on quarter-wavelength transformers, such as that of Stengel et al., are too bulky for the compact and inexpensive personal wireless communication devices favored by consumers. The quarter-wavelength transformer occupies a large portion of space on an integrated circuit because it must be as long as one-quarter of the wavelength of the signal passing through it. For a cellular telephone signal having a center frequency of 1.9 GHz, the quarter-wavelength transformer is about 2.5 cm long for a typical phone board with dielectric constant of about 3.8. It thus consumes a large space in the device if implemented as part of the integrated circuit and requires a large area on the integrated circuit, unduly increasing its size and cost. In another aspect, a quarter-wavelength transformer has a relatively limited frequency response that is too inflexible for communication devices operating in multiple frequency bands.

Another approach is to use switches to improve the isolation and reduce the leakage effects. Switches, however, can also be physically large and impractical unless integrated on the same IC as the power amplifier.

SUMMARY OF THE INVENTION

The present invention relates to an RF/Microwave multi-stage power amplifier that overcomes limitations of the above-described designs. In a preferred embodiment, the multi-stage power amplifier comprises two or more amplifying stages each having an input and an output. The input of the first amplifying stage is also connected to the input of the second amplifying stage. The power amplifier further comprises primary and secondary impedance matching networks. The primary impedance matching network is connected at its input to the output of the first amplifying stage and at its output to a load. The secondary impedance matching network is connected between the outputs of the first and second amplifying stages. The power amplifier further comprises a control circuit that can alternatively enable/disable each amplifying stage.

In accordance with a preferred embodiment, the multi-stage power amplifier of the present invention is capable of multi-mode operation. In one aspect, amplifying stages may have different power capacities. For example, the first amplifying stage may have greater power capacity than the second amplifying stage, which enables the power amplifier to operate in two output power modes when the amplifying stages are alternately enabled. In another aspect, the amplifying stages may be configured to amplify linearly or non-linearly depending on the signal modulation scheme employed by the communication device. To this end, the power amplifying transistors within the amplifying stages may be biased at the same or different operating points.

In accordance with a preferred embodiment, the multi-stage power amplifier of the present invention is capable of efficient signal amplification in multiple operating modes. In one operating mode, the first amplifying stage (high power) is enabled while the second amplifying stage (low power) is disabled. The secondary impedance matching network is switched out and has no impact on the impedance of the primary matching network. The resulting output impedance sets the output power of the active stage to its peak value, thereby improving its efficiency. In another operating mode, the first amplifying stage is disabled and the second amplifying stage is enabled. The secondary impedance matching network is presented between the amplifying stages and the primary impedance matching network, thereby raising the impedance of the primary matching network. The resulting output impedance sets the output power of the active stage to its peak value, thereby improving its efficiency.

In one aspect, the present invention comprises an impedance matching network for use with a multi-stage power amplifier. The impedance network comprises primary and secondary impedance matching networks. The primary impedance matching network is preferably connected to an output of a first amplifying stage. The secondary impedance matching network is preferably connected between the outputs of the first and second amplifying stages. As a result, when the second amplifying stage is disabled and the first amplifying stage is enabled, the enabled stage is presented with a first predetermined output impedance that is suitable for its efficient operation. Alternatively, when the first amplifying stage is disabled and second amplifying stage is enabled, the enabled stage is presented with a second output impedance suitable for its efficient operation.

In another aspect, the present invention comprises a method for matching a load impedance to a multi-stage power amplifier having at least two different amplifying stages. The method comprises two steps: First, providing a first impedance matching network to transform impedance of the load to a first impedance, which is presented to the first active amplifying stage to enable its efficient operation. And second, providing a second impedance matching network to transform the first impedance to the second impedance, which is presented to the second active amplifying stage to enable its efficient operation.

BRIEF DESCRIPTION OF THE DRAWINGS

The invention will be described by reference to the preferred and alternative embodiments thereof in conjunction with the drawings in which.

DETAILED DESCRIPTION

Figure 1:
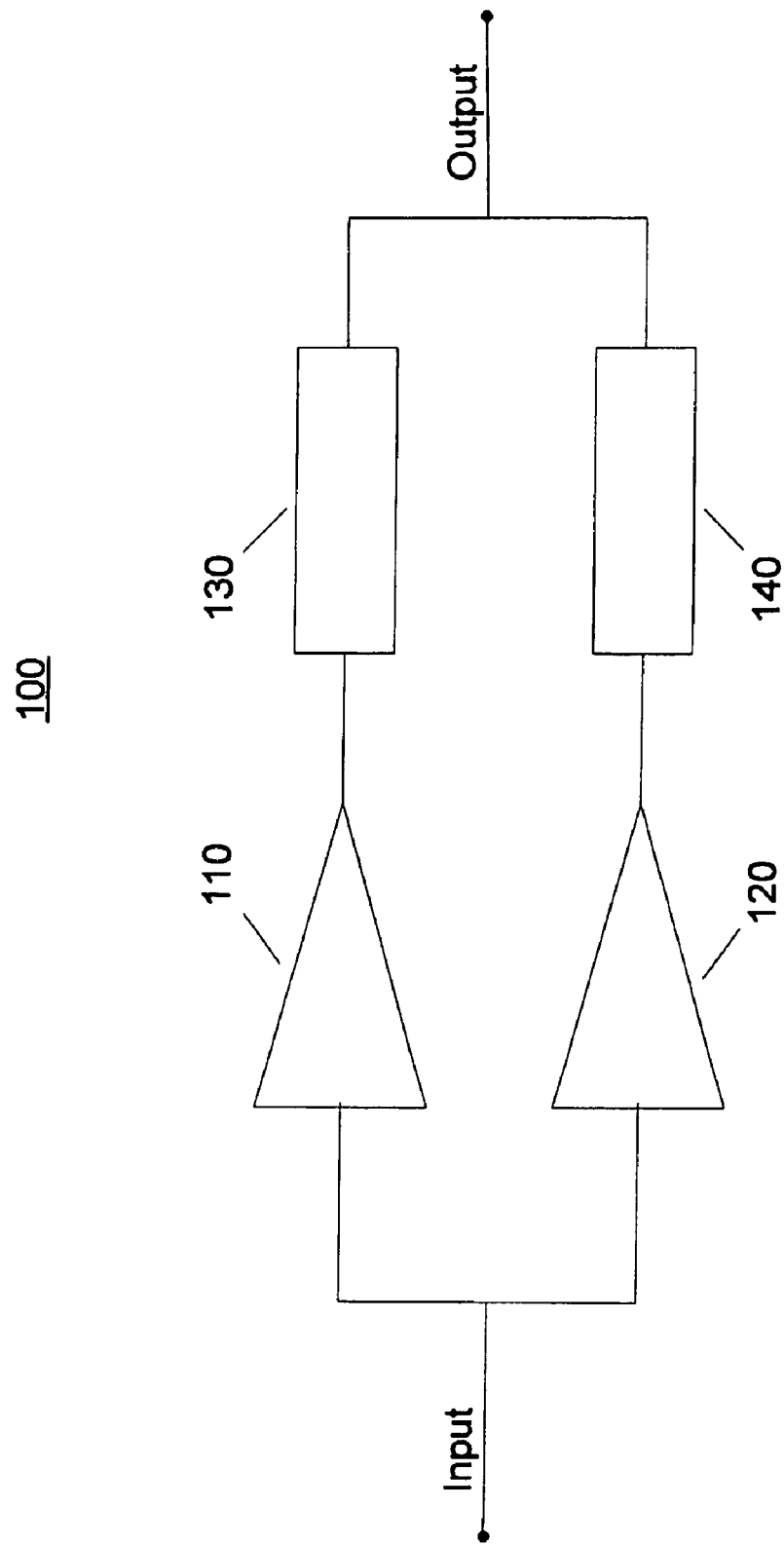
FIG. 1 is a block diagram of a multi-stage power amplifier having parallel stages.
Figure 2:
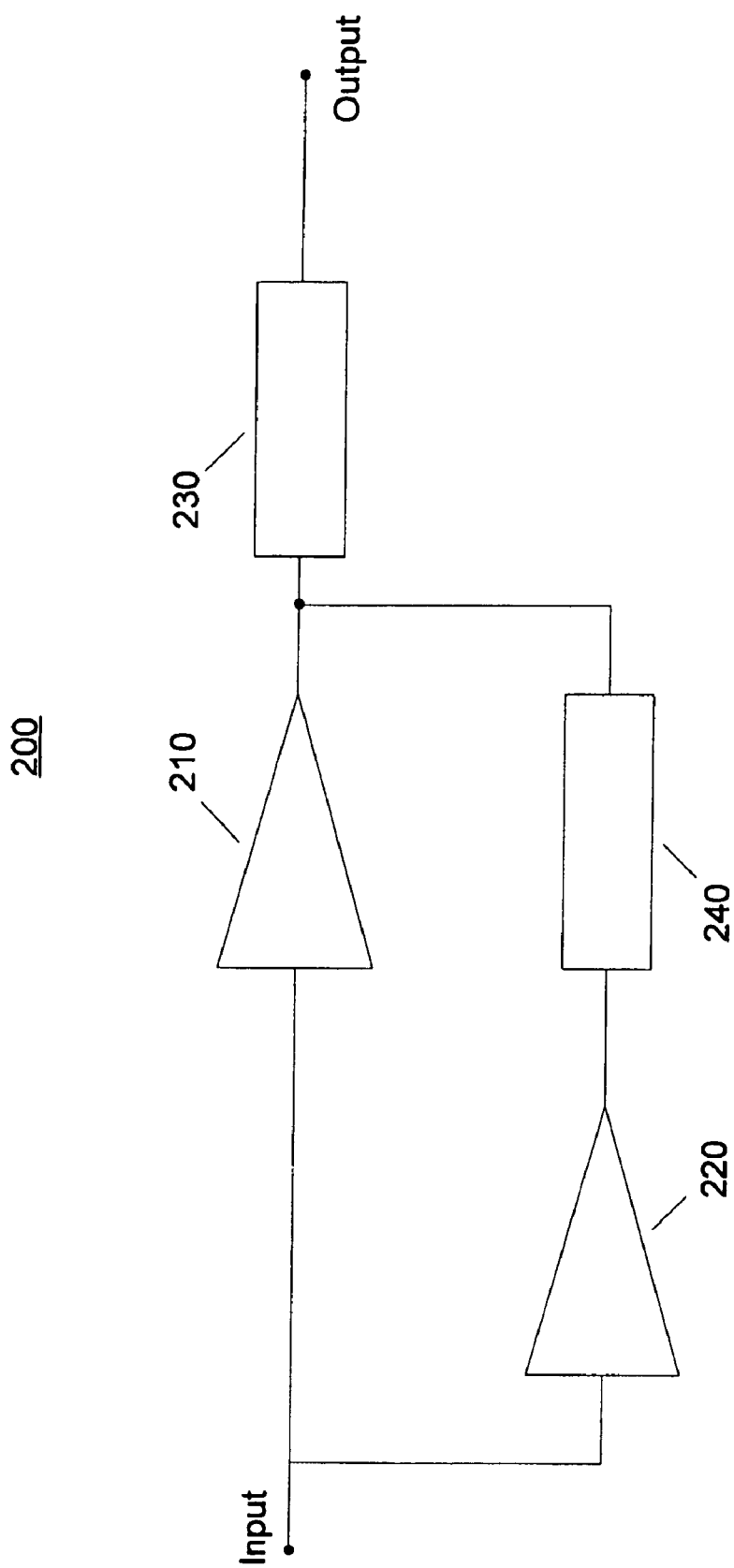
FIG. 2 is a block diagram of a multi-stage RF/Microwave power amplifier according to the one embodiment of the present invention.

A block diagram of an RF/Microwave multi-stage power amplifier in accordance with a preferred embodiment of the invention is shown in FIG. 2. Power amplifier 200 comprises two amplifying stages 210 and 220, an output matching network 230, connected to the output of the first amplifying stage, and an output pre-matching network 240, connected between the outputs of amplifying stages 210 and 220. Power amplifier 200 further comprises power control circuits (not shown) connected to amplifying stages 210 and 220 that are capable of enabling or disabling each stage. By means of this circuit topology, amplifying stage 210 may be presented with a first predetermined output impedance suitable for its efficient operation, while amplifying stage 220 may be presented with a second output impedance suitable for its efficient operation.

In a preferred embodiment, amplifying stage 210 has a greater power capacity than amplifying stage 220, which enables power amplifier 200 to operate in two output power modes when the amplifying stages are alternately enabled. In the high power mode, amplifying stage 210 is enabled while amplifying stage 220 is disabled. The output pre-matching network 240 acts as a shunt to amplifying stage 210, which lowers the impedance at the output of amplifying stage 210. The resulting output impedance sets the output power of active stage 210 to its peak value, thereby improving the efficiency of the high power mode. In the low power mode, amplifying stage 210 is disabled and amplifying stage 220 is enabled. The output pre-matching network 240 is presented between amplifying stages 210 and 220 and the output matching network 230, thereby raising the impedance of primary matching network 230. The resulting output impedance sets the output power of active stage 220 to its peak value, thereby improving the efficiency of the low power mode.

Figure 3A:
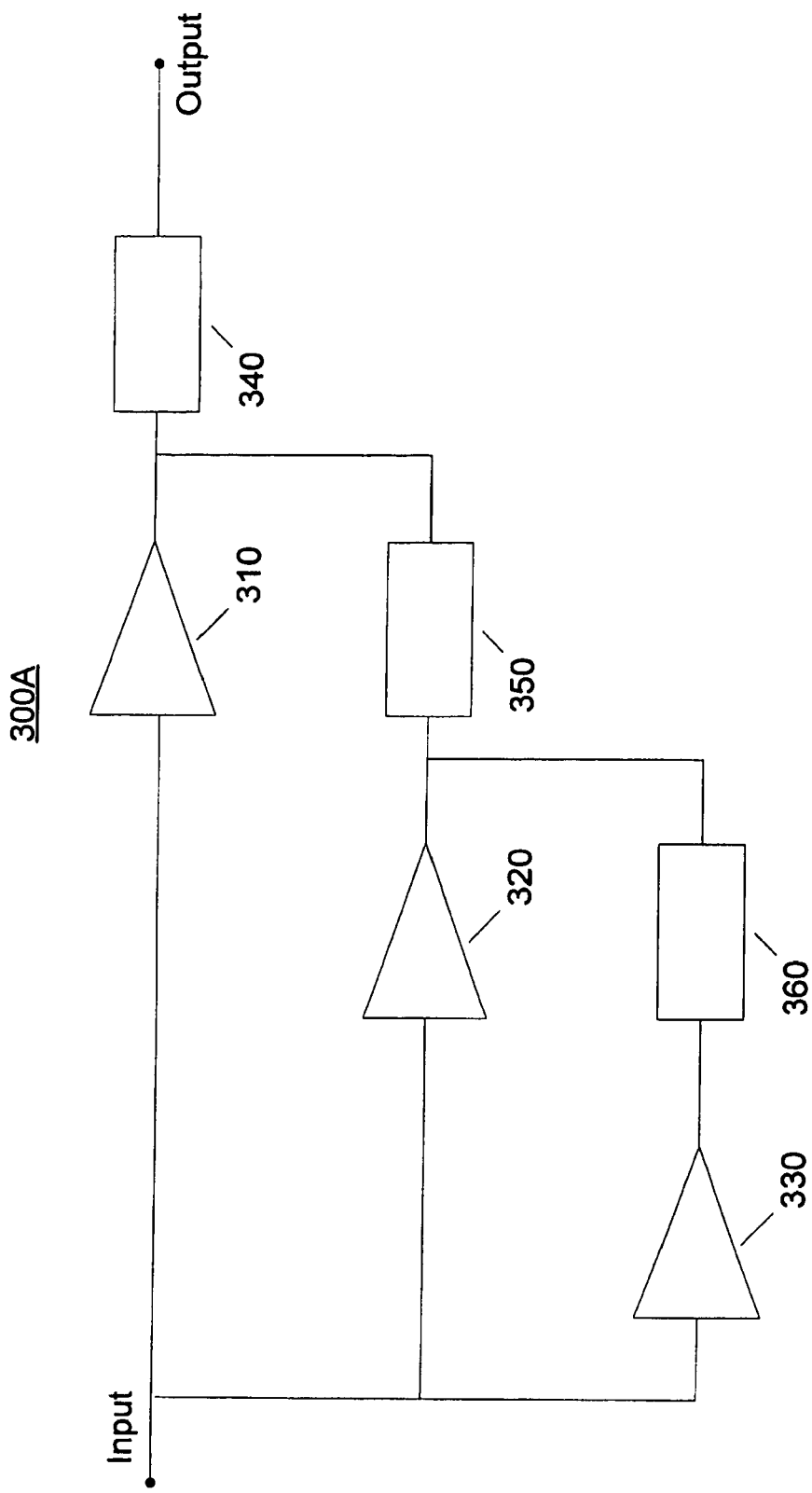
FIG. 3A is a block diagram of the multi-stage RF/Microwave power amplifier according to an aspect of the invention.

In another exemplary embodiment, the power amplifier of the present invention may comprise more than two amplifying stages to provide a plurality of output power modes, as shown, for example in FIG. 3A. There, power amplifier 300A comprises three amplifying stages 310, 320, and 330, and primary, secondary and tertiary impedance matching networks 340, 350, and 360, respectively. Of course, the total number of the amplifying stages may be chosen depending on the desired number of output power modes. As in the circuit configuration of FIG. 2, amplifying stages 310, 320, and 330 may have different or equal power capacities to provide an increased dynamic range of operation. Power amplifier 300A operates by selectively enabling its amplifying stages 310, 320, and 330 while presenting a different value of output impedance to the active stage to improve efficiency of the active stage.

Figure 3B:
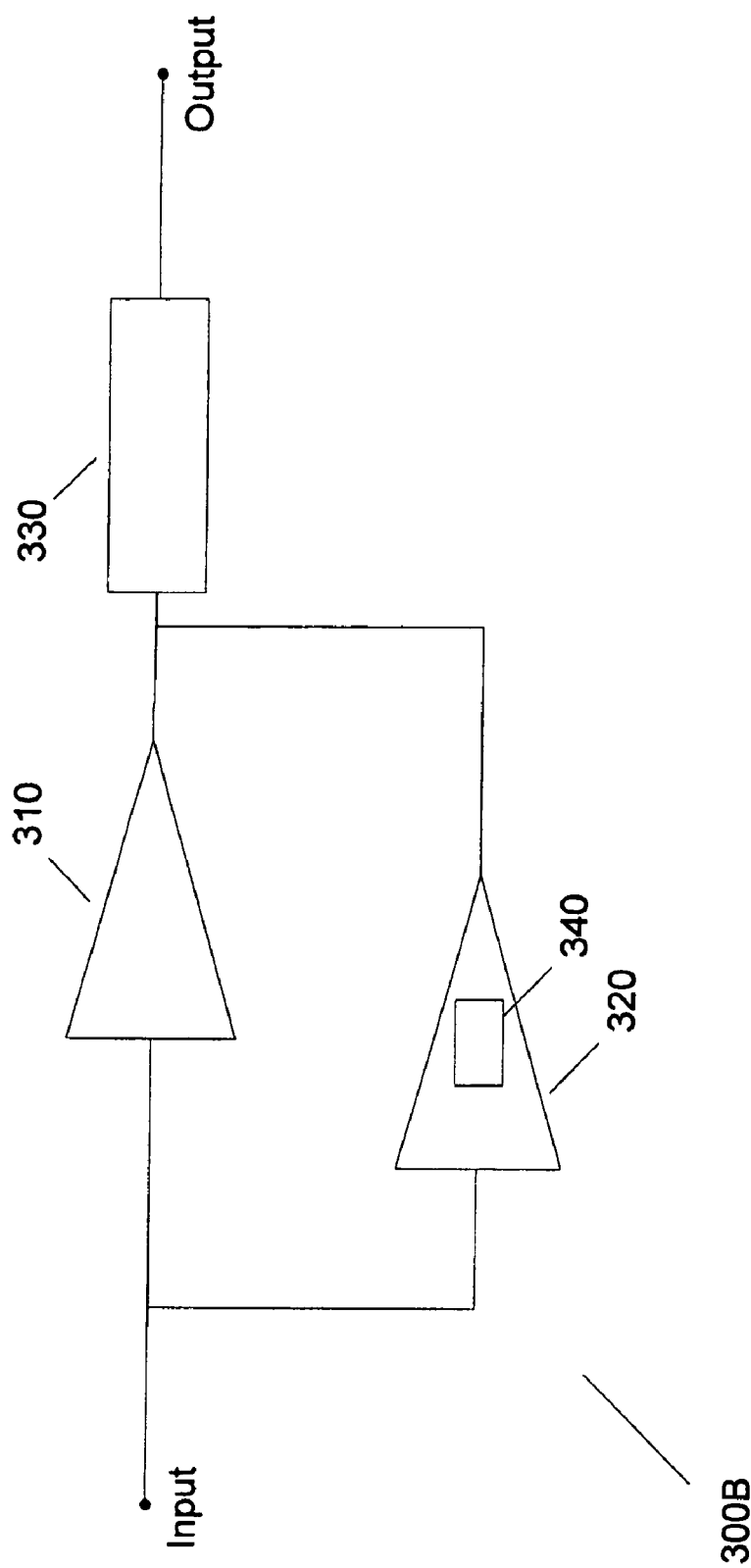
FIG. 3B is a block diagram of the multi-stage RF/Microwave power amplifier according to another aspect of the invention.

In yet another exemplary embodiment, secondary impedance matching network may be implemented as an integral part of the second amplifying stage, as shown, for example, in FIG. 3B. In particular, multi-stage power amplifier 300B comprises two amplifying stages 310 and 320 and primary and secondary impedance matching networks 330 and 340. Secondary impedance matching network 340 is implemented as part of amplifying stage 320 and not isolated physically or functionally from amplifying stage 320. Of course, as one skilled in the art will readily recognize, impedance matching network 340 of the present embodiment functions similarly to secondary matching network of the preferred embodiment of the invention.

Figure 4:
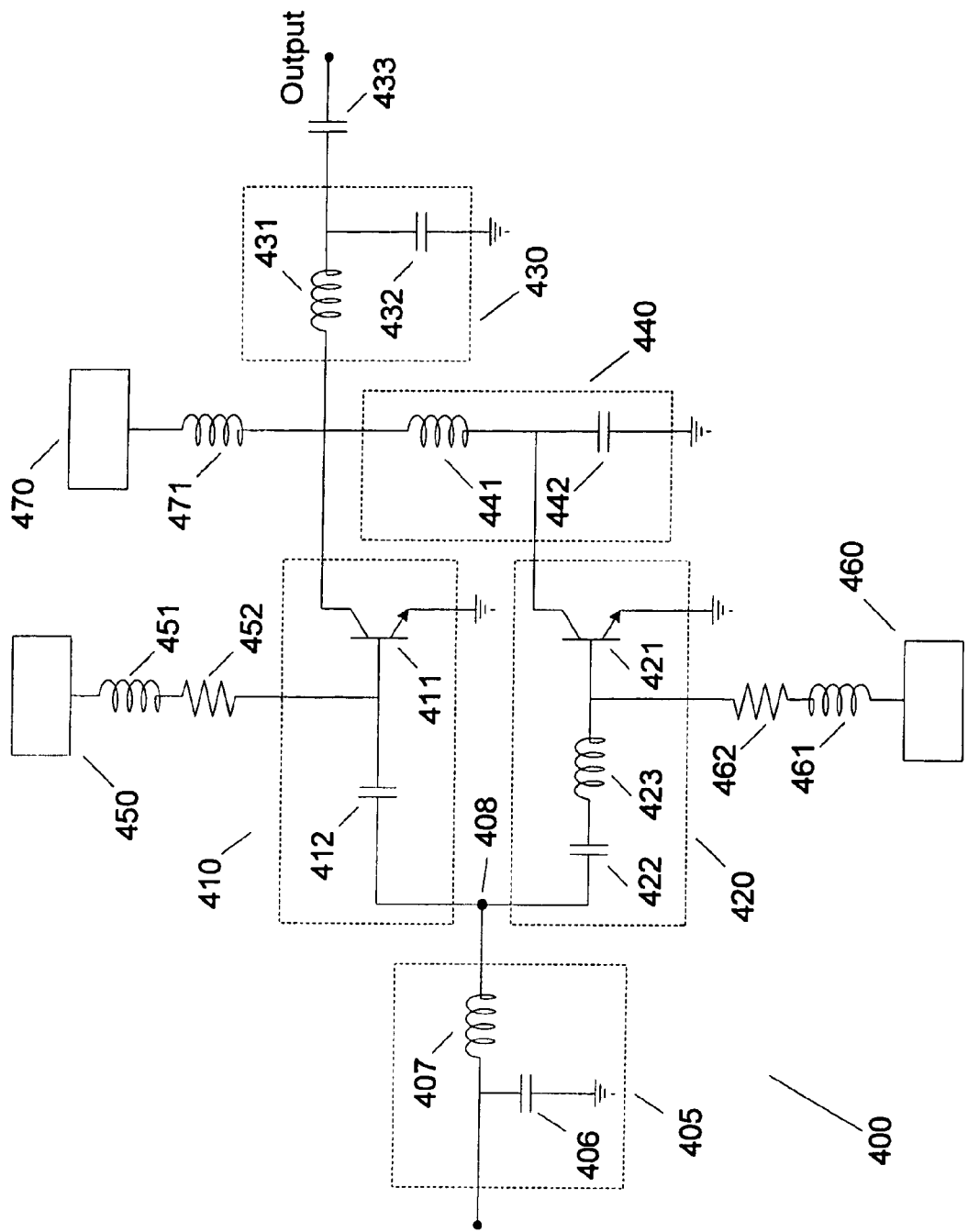
FIG. 4 is a schematic diagram of a multi-stage RF/Microwave power amplifier according to a preferred embodiment.

A schematic diagram of a preferred embodiment of the multi-stage power amplifier of the present invention is shown in FIG. 4. Power amplifier 400 comprises: an input impedance matching network 405; two amplifying stages 410 and 420, connected at their inputs to the input matching network 405; output impedance matching network 430, connected between the output of the amplifying stage 410 and the output of the power amplifier 400; interstage impedance matching network 440, connected between the outputs of amplifying stages 410 and 420; and bias circuits 450, 460, and 470, connected to amplifying stages 410 and 420.

Input impedance matching network 405 matches the system impedance (typically 50Ω) or the output impedance of a pre-amplifier (not shown) to the input impedance of power amplifier 400, thereby enhancing the transfer of power between the two. Input impedance matching network 405 comprises shunt capacitor 406 and series inductor 407, and is connected to power amplifying stages 410 and 420 at node 408. Input matching network 405 is not limited to any single configuration of elements; it may be implemented using lumped or distributed elements.

Parallel power amplifying stages 410 and 420 include power amplifying transistors 411 and 421, respectively. Preferably, transistor 411 has a greater power capacity than transistor 421 thereby enabling power amplifier 400 to operate in two distinct output power modes by selectively enabling the amplifying stages 410 and 420. In particular, the high power transistor 411 has a larger-size emitter area, and therefore a longer periphery bounding the emitter area, than the low power transistor 421, which enables transistor 411 to support greater output signal power than transistor 421. In other words, for similar input signal, transistor 411 generates a larger output signal than transistor 421. In other embodiments, the high power amplifying stage 410 may further comprise an intermediate amplifying stage having an input connected to the RF input of the power amplifier 400 and an output connected to the input of an output amplifying stage. In other embodiments, the transistors may be sized to be substantially equal in size and in output power and configured such that in the low power mode one of the transistors is off and in high power mode, both transistors are on.

First amplifying stage 410 further includes DC decoupling capacitor 412, which blocks DC signals while allowing input RF signals through. The second power amplifying stage includes DC decoupling capacitor 422 and inductor 423. They serve as additional input impedance matching elements for coupling the output of the pre-amplifier to the input of transistor 411, thus enhancing the transfer of energy between the pre-amplifier and transistor 421.

Biasing circuits 450, 460, and 470 along with RF chokes 451, 461, and 471, and resistors 452 and 462 serve to enable and disable transistors 411 and 421. Chokes 451 and 461 have large inductance for blocking transient AC signals that may be produced in biasing circuits 450 and 460, respectively. Resistors 452 and 462 set proper levels of DC current to bias transistors 411 and 421. To enable transistors 411 and 421, biasing circuits 450 and 460 apply DC bias signals to the respective base terminals of transistors 411 and/or 421, that are appropriate to bias them into either an active mode or saturation mode of operation, depending on whether transistor 411 and 421 are to provide linear (class A) or non-linear (class AB, B, C, E or F) signal amplification. When enabled, transistor 411 or 421 sources its collector DC current from collector bias circuit 470 through an RF choke 471. To disable transistors 411 and 421, biasing circuits 450 and 460 apply DC bias signals that set transistors 411 or 421 into cutoff. For example, to enable a heterojunction bipolar transistor (HBT), the bias circuit preferably generates DC voltage greater then 1.3V (i.e., HBT's forward base-emitter voltage), whereas to disable an HBT, such DC voltage is preferably less than 1.3V.

Output and interstage (or pre-match) impedance matching networks 430 and 440 facilitate the transfer of energy between transistors 411 and 421 and a load (i.e., antenna). The output impedance matching network 430 preferably comprises a series inductor 431 and a shunt capacitor 432. The interstage (or pre-match) impedance matching network preferably comprises an inductor 441. A shunt capacitor 442 may also be used to for impedance matching. A DC blocking capacitor 433 may be used to block DC components of the output RF signal. Impedance matching networks 430 and 440 are not limited to any single configuration of elements; design alternatives for lumped elements and distributed elements may be substituted. Preferably, the values of the inductors 431 and 441, and capacitors 432 and 442 are chosen to set output powers of the first and second amplifying stage to their peak magnitudes, thereby improving the efficiency of the power amplifier. Inductor 441 is preferably an on-chip spiral inductor thereby allowing for the fabrication of a compact MMIC RF power amplifier.

According to a preferred embodiment, power amplifier 400 operates in the high power mode when transistor 411 is enabled and transistor 421 is disabled. In particular, transistor 411 is enabled by forward biasing its emitter-base junction and reverse biasing the collector-base junction via bias circuit 450, so that transistor 411 operates in its active region. Transistor 421, meanwhile, is disabled by reverse-biasing its collector-base and emitter-base junctions via bias circuit 460, which thereby places transistor 421 into cutoff. As a result, the RF signal is amplified by amplifying stage 410 alone.

Figure 5:
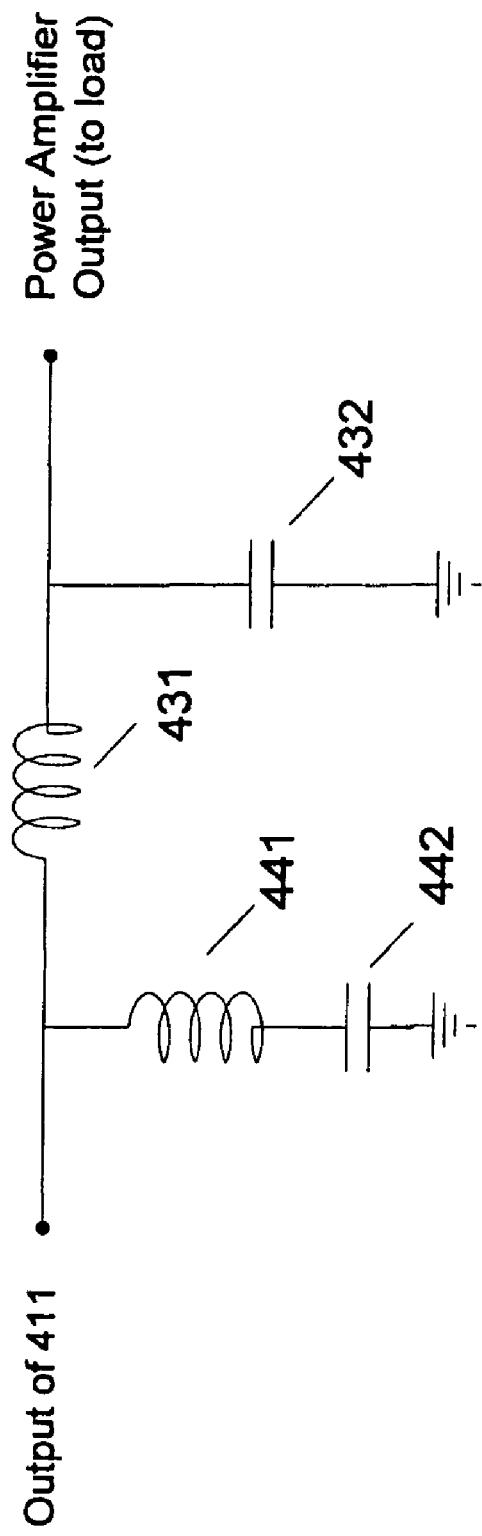
FIG. 5 is a schematic diagram of an impedance matching network in the high power operating mode.

FIG. 5 shows the configuration of the output impedance matching network 430 and the interstage (or pre-match) matching network 440 when power amplifier 400 operates in high power mode. In particular, inductor 441 and bypass capacitor 442 are presented at the output of transistor 411. Inductor 441 and capacitor 442 may be chosen so as to form a series resonant circuit at the second harmonic providing a near short circuit termination to improve efficiency as is done in Class F amplifiers. The output impedance network is also presented at the output of transistor 411: inductor 431 between the output of transistor 411 and the load, and shunt capacitor 432 connected to ground. The resulting matching configuration, also known as π-network, provides a large step-down in impedance from a system load impedance of 50Ω to a transistor output impedance in the range of about 1-10Ω and typically about 3Ω. With this impedance match, transistor 411 delivers high linear power with high efficiently (i.e., low current drain). It should be noted that the values of the impedance matching elements may vary, depending on the desired operating mode of the active transistor.

Power amplifier 400 operates in the low power mode when transistor 421 is enabled and transistor 411 is disabled. In particular, transistor 421 is enabled by forward-biasing its emitter-base junction and reverse-biasing its collector-base junction via bias circuit 460, such that transistor 421 operates in its active region. Transistor 411, meanwhile, is disabled by reverse-biasing its collector-base and emitter-base junctions via bias circuit 450. As a result, the RF signal is amplified by amplifying stage 420 alone. Because of the way in which the output and interstage matching networks 430 and 440 are connected, the effective impedance seen by the output of transistor 421 when transistor 411 is in cutoff is shown in FIG. 6.

Figure 6:
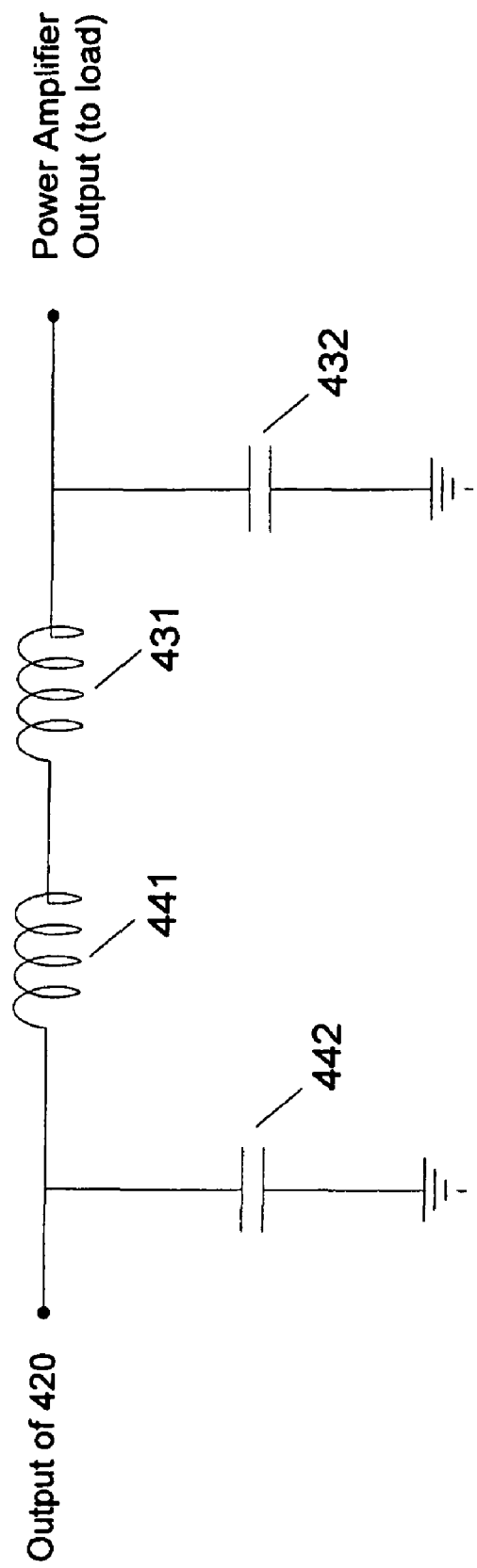
FIG. 6 is a schematic diagram of an impedance matching network in the low power operating mode.

With reference to FIG. 6, bypass capacitor 442 is connected to ground at the output of transistor 421. Inductors 431 and 441, of the output and interstage impedance networks, are connected in series between the output of transistor 421 and the load. Shunt capacitor 432 is connected to ground in parallel with the load. The resulting matching configuration provides a net step-down in impedance from a system load impedance of 50Ω to a transistor output impedance in the range of about 20-40Ω and typically about 30Ω. With this impedance step-down, transistor 421 operates efficiently as a low-distortion, low-power amplifier taking advantage of the entire available peak-to-peak output voltage range.

Embodiments of multi-stage power amplifier 400 have been tested at a frequency of 1.9 GHz and demonstrated highly efficient operation in both the low and high power modes. The results of the test indicated that in the high power mode, in which amplifying stage 420 was disabled and amplifying stage 410 was operating at its peak output power of 28 dBm, the power added efficiency (PAE) of the amplifier 400 was about 40%. In the low power mode, in which amplifying stage 410 was disabled and amplifying stage 420 was operating at its peak output power of 16 dBm, the power added efficiency of the amplifier 400 was about 20%.

Figure 7:
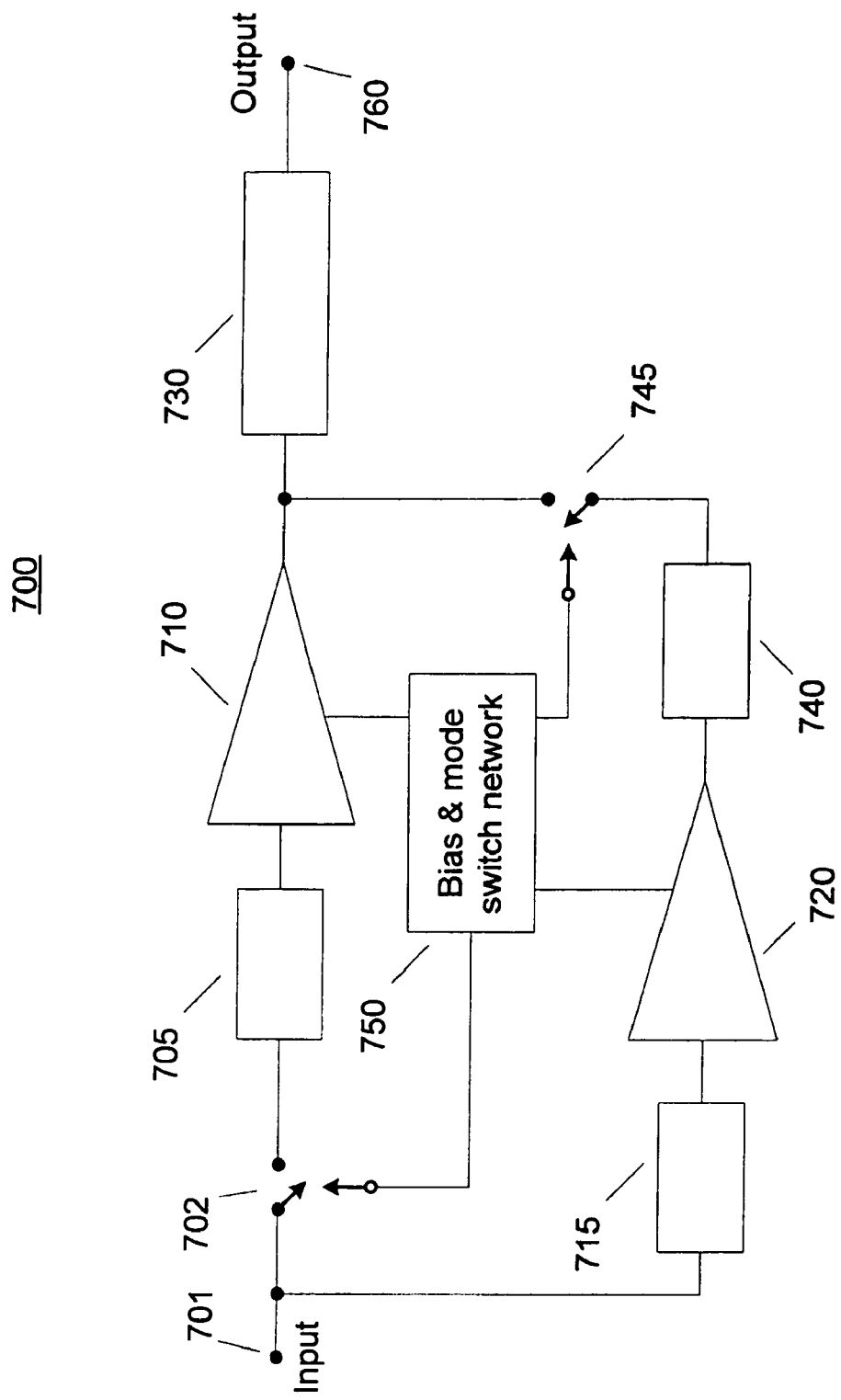
FIG. 7 is a schematic diagram of another embodiment of the present invention.

FIG. 7 is a schematic diagram of another embodiment of the present invention. In FIG. 7, the output of a first amplifying stage 710 is connected to an output 760 of a power amplifier 700 through an output matching network 730. In some embodiments, the output matching network 730 may include an inductor connected in series between the output of the first amplifying stage 710 and the power amplifier output 760 and a shunt capacitor between the inductor and the power amplifier output 760 similar to the output matching network 430 of FIG. 4. The first amplifying stage 710 receives an input RF signal from a power amplifier input 701 through an input matching network 705. Input matching network 705 provides impedance matching for efficient energy transfer of the signal to an input of the first amplifier stage 710. An optional switch 702 may be located between the power amplifier input 701 and the input of the first amplifying stage 710. The optional switch 702 may be used to isolate the first amplifier stage 710 when a second amplifier stage 720 is selected. Optional switch 702 is controlled by a bias and mode switch network 750.

The second amplifying stage 720 receives the RF input to the power amplifier 700 through a second input matching network 715. The second input matching network 715 provides impedance matching for efficient energy transfer of the signal to an input of the second amplifying stage 720. An output of the second amplifying stage 720 is connected to the output of the first amplifying stage 710 through a pre-matching network 740 and an interstage switch 745. In some embodiments, the pre-matching network 740 may include an inductor connected in series between the output of the first and second amplifying stages and a shunt capacitor connected between the output of the second amplifying stage 720 and ground is similar to the interstage matching network 440 of FIG. 4.

The bias and mode switch network 750 provides the biasing and supply voltages to both first amplifier stage 710 and second amplifier stage 720 and controls the operation of optional switch 702 and interstage switch 745. In some embodiments, the bias and mode switch network 750 may close optional switch 702 and open switch 745 when the high power mode is selected and open switch 702 and close switch 745 when the low power mode is selected. In other embodiments that do not include optional switch 702, the bias and mode switch network 750 may open switch 745 and provide biasing current or voltage to the first amplifier stage 710 while biasing the second amplifier stage 720 into cutoff when the high power mode is selected. When the low power mode is selected, the bias and mode switch network 750 closes switch 745 and provides the proper biasing current or voltage to the second amplifier stage 720 while biasing the first amplifier stage 710 into cutoff.

In some embodiments where the first amplifying stage 710 is a Class F amplifier, the interstage switch 745 may be combined with the inductor of the pre-matching network 740 to form a switched center-tapped inductor such that the pre-matching network 740 provides the desired impedance match when the second amplifying stage 720 is selected and provides a second harmonic trap when the first amplifying stage is selected. The interstage switch 745 in these embodiments provides isolation between output transistors while also providing harmonic terminations for the activated output transistor. This eliminates the need for separate harmonic traps and allows for a smaller size circuit.

In a preferred embodiment, the components shown in FIG. 7 are fabricated as an MMIC. Interstage switch 745 may be an integrated switch such as, for example, a MESFET, PHEMT, or PIN diode device depending on the technology of the MMIC (Microwave Monolithic Integrated Circuit). Methods for fabricating the RF switch on the same chip as the amplifier stages are disclosed in U.S. Pat. No. 6,998,920 issued Feb. 14, 2005 and U.S. Pat. No. 7,015,519 issued Mar. 21, 2006, which are incorporated herein by reference in their entirety. Capacitors may be fabricated as Metal-Insulator-Metal (MIM) capacitors on the chip. Inductors may be small, on-chip spiral inductors.

Figure 8:
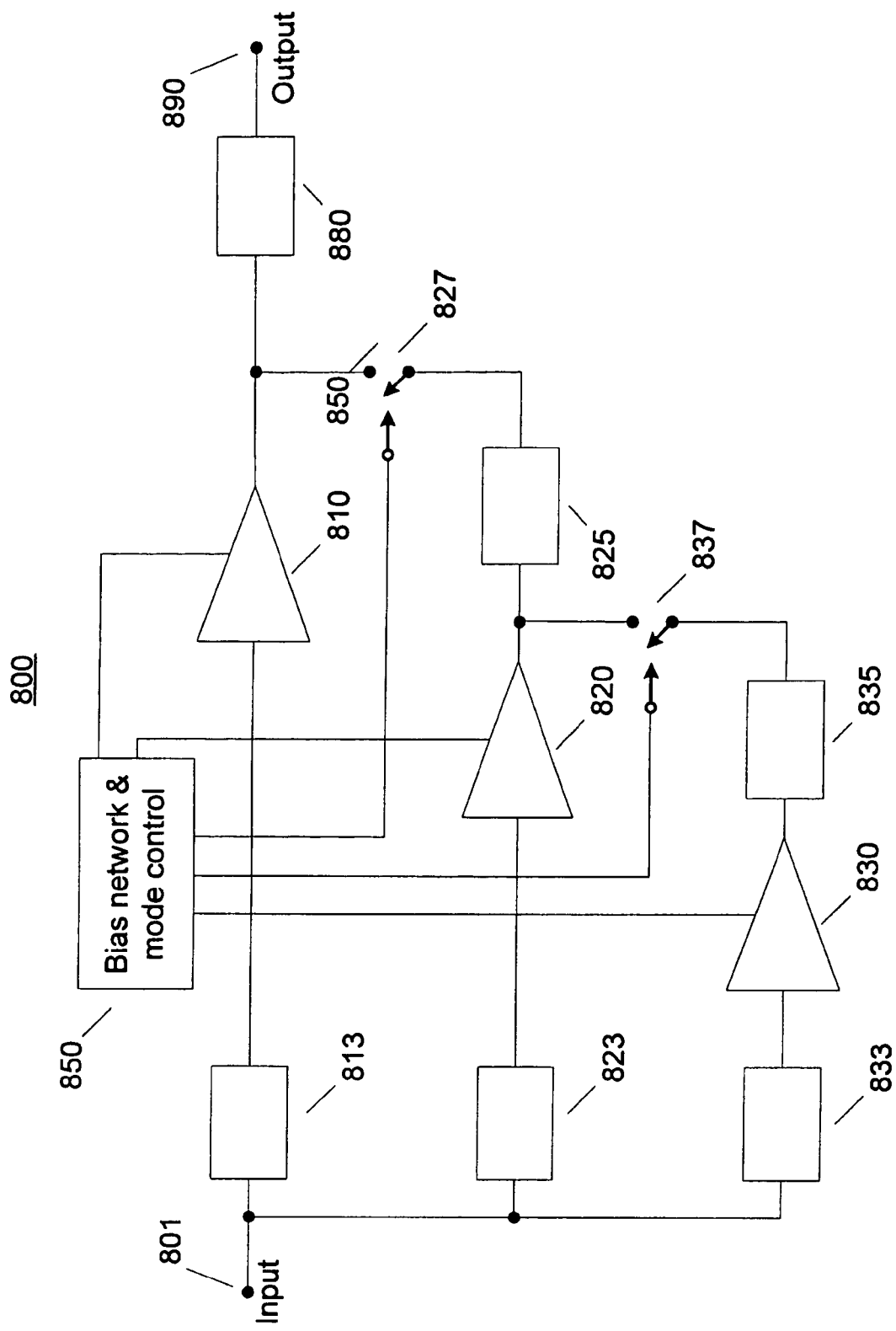
FIG. 8 is a schematic diagram of another embodiment of the present invention.

FIG. 8 is a schematic diagram of another embodiment of the present invention similar to that shown in FIG. 3A where interstage switches 827 and 837 provide isolation between the three amplifier stages. In FIG. 8, an output of the first amplifier stage 810 is connected to the power amplifier output 890 through an output matching network 880. An output of the second amplifier stage 820 is connected to the output of the first amplifier stage 810 through a first interstage matching network 825 and a first interstage switch 827. An output of the third amplifier stage 830 is connected to the output of the second amplifier stage 820 through a second interstage matching network 835 and a second interstage switch 837. The inputs of the amplifier stages 810, 820, and 830 are connected to an RF input 801 of the power amplifier 800 through input matching networks 813, 823, and 833, respectively. Each input matching network 813, 823, and 833 is designed to provide optimum power transfer between the power amplifier input 801 and the inputs of each of the amplifier stages 810, 820, and 830.

A bias network and mode control 850 provides the proper bias and supply voltages to each of the amplifier stages 810, 820, and 830. The bias network and mode control 850 also controls the operation of the RF interstage switches 827 and 837. When the high power mode is selected, the bias network and mode control 850 opens interstage switch 827 to isolate the output of the second and third amplifier stages 820 and 830 from the output of the first amplifier stage 810. The bias network and mode control 850 also biases the second and third amplifier stages 820 and 830 into the cutoff operating mode and provides the desired biasing voltages or currents to the first amplifier stage 810. The output matching network 880 is selected to provide the desired impedance match to optimize the power transfer from the output of the first amplifier stage 810 and the output of the power amplifier 800.

When the medium power mode is selected, the bias network and mode control 850 closes interstage switch 827, opens interstage switch 837 to isolate the output of the third amplifier stage 830 from the output of the second amplifier stage 820 and biases the first and third amplifier stages 810 and 830 into cutoff. The bias network and mode control 850 provides the desired biasing voltages or currents to the second amplifier stage 820. The first interstage matching network 825 is selected such that the matching network comprised of the first interstage matching network 825 in series with the output matching network 880 provides the desired impedance match to optimize the power transfer from the output of the second amplifier stage 810 and the output of the power amplifier 800.

When the low power mode is selected, the bias network and mode control 850 closes interstage switches 837 and 827 and biases the first and second amplifier stages 810 and 820 into cutoff. The bias network and mode control 850 provides the desired biasing voltages or currents to the third amplifier stage 830. The second interstage matching network 835 is selected such that the matching network comprised of the second interstage matching network 835 in series with the first interstage matching network 825 in series with the output matching network 880 provides the desired impedance match to optimize the power transfer from the output of the third amplifier stage 830 and the output of the power amplifier 800.

In an exemplar embodiment based on the design illustrated in FIG. 8, the first, second, and third amplifier stages are fabricated to provide 28 dBm, 16 dBm, and 7 dBm output power, respectively. The output impedance of the first, second, and third amplifier stages are about 3Ω, 30Ω, and 250Ω, respectively. The output matching network 880 may be selected to provide an impedance step-down from the 50Ω load to the 3Ω output impedance of the first amplifier stage. The first interstage matching network 825 may be selected such that the first interstage matching network 825 in series with the output matching network 880 provides an impedance step-down from the 50Ω load to the 30Ω output impedance of the second amplifier stage. The second interstage matching network 835 may be selected such that the second interstage matching network 835 in series with the first interstage matching network 825 in series with the output matching network 880 provides an impedance step-up from the 50Ω load to the 250Ω output impedance of the third amplifier stage.

The high efficiency with good linearity in both the low and high power modes for embodiments of the present invention allows for designs that do not include a DC-to-DC converter. DC-to-DC converters are commonly used in multi-power mode amplifiers to provide a different supply voltage for each of the power modes of the amplifier. For, the high power mode, the DC-to-DC converter supplies the full battery voltage to allow for the full RF voltage swing. In the low power mode, the DC-to-DC converter supplies a lower voltage to increase the efficiency of the low power operation because the RF voltage swing is smaller in the low power mode. Eliminating the need for a DC-to-DC converter also eliminates the need for the high value capacitors and inductors used by the DC-to-DC converter, thereby reducing both the cost and size of the amplifier.

The present invention provides advantages such as the ability to select the size of the amplifying stage to provide a desired output power level. In addition, the circuit elements constituting the primary and secondary impedance matching networks can be derived via the Smith chart or computer simulation to provide efficient operation of every amplifying stage. Furthermore, the power amplifier of the present invention can be implemented as a BJT, FET, MESFET, MOSFET, HFET, HBT, HEMT, and PHEMT. Moreover, the power amplifier of the present invention exhibits efficient low and high power modes. The size of the power amplifier is substantially reduced, in comparison with the prior art designs, since quarter-wavelength transformers are not used. The entire power amplifier, excluding the final output matching but including the bias circuits, can be easily integrated on a single chip through conventional MMIC (Monolithic Microwave Integrated Circuit) processes. Moreover, the complexity involved in designing the multi-stage power amplifier is reduced as well.

All references cited above are incorporated herein by reference in their entirety. Having thus described at least illustrative embodiments of the invention, various modifications and improvements will readily occur to those skilled in the art and are intended to be within the scope of the invention. Accordingly, the foregoing description is by way of example only and is not intended as limiting. The invention is limited only as defined in the following claims and the equivalents thereto.

What is claimed is:

1. A power amplifier comprising:
    a first amplifier stage;
    an output impedance matching network connecting an output of the first amplifier stage to an output of the power amplifier;
    a second amplifier stage;
    a first interstage impedance matching network connecting an output of the second amplifier stage to the output of the first amplifier stage; and
    a first interstage switch connected in series with the first interstage impedance matching network and located between the output of the first amplifier stage and the first interstage impedance matching network,
    wherein the output impedance matching network optimizes power transfer from the output of the first amplifier stage to the output of the power amplifier and the first interstage impedance matching network in series with the output impedance matching network optimizes power transfer from the output of the second amplifier stage to the output of the power amplifier.

2. The power amplifier of claim 1 wherein the first interstage impedance matching network comprises:
    an inductor connected in series between the first and second amplifier stage; and
    a shunt capacitor connected between the output of the second amplifier stage and a ground.

3. The power amplifier of claim 1 further comprising:
    a third amplifier stage; and a second interstage impedance matching network connecting an output of the third amplifier stage with the output of the second amplifier stage, wherein the second interstage impedance matching network in series with the first interstage impedance matching network in series with the output impedance matching network optimizes power transfer from the output of the third amplifier stage to the output of the power amplifier.

4. The power amplifier of claim 3 further comprising a second interstage switch connected in series with the second interstage impedance matching network and located between second interstage impedance matching network and the output of the second amplifier stage.

5. A power amplifier for providing an amplified signal to a load comprising:
- a high power amplifying stage for amplifying an input signal and generating an amplified signal at an output of the high power amplifier stage;
- a first inductor connected in series between the output of the high power amplifier stage and the load;
- a first capacitor connected between the first inductor and a ground;
- a low power amplifying stage for amplifying an input signal and generating a second amplified signal at an output of the low power amplifier stage
- a second inductor connected in series between the output of the low power amplifier stage and the output of the high power amplifier stage;
- a second capacitor connected between the output of the low power amplifier stage and the ground; and
- an RF switch connected in series with the second inductor and located between the output of the high power amplifier stage and the second inductor.

6. The power amplifier of claim 5 wherein the first inductor, first capacitor, second inductor, and second capacitor are selected to match an impedance of the load with an impedance of the low power amplifying stage.

7. The power amplifier of claim 6 wherein the first inductor, first capacitor, second inductor, and second capacitor are selected to match the load impedance with an impedance of the high power amplifying stage.

8. The power amplifier of claim 5 wherein the first and second amplifying stages are selectively enabled.

9. The power amplifier of claim 5 wherein the first inductor and first capacitor are selected to match an impedance of the load with an impedance of the high power amplifying stage.

10. The power amplifier of claim 5 operable to amplify in the radio frequency (RF)/microwave ranges.

11. The power amplifier of claim 5 operable in a cellular telephone.

12. A power amplifier comprising:
- a first amplifier stage;
- an output impedance matching network connecting an output of the first amplifier stage to an output of the power amplifier;
- a second amplifier stage;
- a first interstage impedance matching network connecting an output of the second amplifier stage to the output of the first amplifier stage;
- a first interstage switch connected in series with the first interstage impedance matching network and located between the output of the first amplifier stage and the first interstage impedance matching network,
- a third amplifier stage;
- a second interstage impedance matching network connecting an output of the third amplifier stage to the output of the second amplifier stage; and
- a second interstage switch connected in series with the second interstage impedance matching network and located between the output of the second amplifier stage and the second interstage impedance matching network, wherein the output impedance matching network optimizes power transfer from the output of the first amplifier stage to the output of the power amplifier, the first interstage impedance matching network in series with the output impedance matching network optimizes power transfer from the output of the second amplifier stage to the output of the power amplifier, and the second interstage impedance matching network in series with the first interstage impedance matching network in series with the output impedance matching network optimizes power transfer from the output of the third amplifier stage to the output of the power amplifier.

13. The power amplifier of claim 12 operable to amplify in the radio frequency (RF)/microwave ranges.

14. The power amplifier of claim 12 operable in a cellular telephone.

15. The power amplifier of claim 1 operable to amplify in the radio frequency (RF)/microwave ranges.

16. The power amplifier of claim 1 operable in a cellular telephone.

* * * * *